United States Patent [19]

Yin

[11] Patent Number: 5,586,865
[45] Date of Patent: Dec. 24, 1996

[54] FAN WITH TRANSITION CHAMBER FOR PROVIDING ENHANCED CONVECTIVE FLOW

[75] Inventor: Ji-Zhong Yin, Fremont, Calif.

[73] Assignee: Micronics Computers Inc., Fremont, Calif.

[21] Appl. No.: 613,247

[22] Filed: Mar. 8, 1996

[51] Int. Cl.$^6$ ............................................. F04D 29/60
[52] U.S. Cl. ................. 415/213.1; 415/119; 165/80.3; 361/695
[58] Field of Search ................. 415/213.1, 119; 165/803; 361/637, 694, 695, 697

[56] References Cited

U.S. PATENT DOCUMENTS

| | | | |
|---|---|---|---|
| 5,202,816 | 4/1993 | DeWilde | 361/695 |
| 5,210,680 | 5/1993 | Scheibler | 361/695 |
| 5,475,562 | 12/1995 | Gow | 361/695 |

*Primary Examiner*—John T. Kwon
*Attorney, Agent, or Firm*—Paul Hentzel

[57] ABSTRACT

Computer apparatus 10 has enhanced convective flow 10F of circulating cooling air provided by improved fan 12. Fan support 12S is secured to the computer apparatus proximate fan port 10P formed in the housing. Fan blade 22B is rotatably mounted within fan support 22S. The propelling action of the fan blade defines a transition path for the cooling air through the fan. Stationary screen 24S is positioned adjacent to the blade traversing the transition path. Transition chamber 26 formed between the screen and the blade also traverses the transition path. The width of the transition chamber defines a transition gap dimension from the screen and to the blade that is optimally selected to enhance the cooling air flow. The transition chamber has a screen region 26S adjacent the screen and a blade region 26B adjacent the blade, and a middle region 26M between the screen region and the blade region. Cooling air flow through the screen and the screen region is generally linear. Cooling air flow through the blade and the blade region has a rotational component. When the transition gap dimension is an optimal, the middle region of the transition chamber is sufficiently wide to allow a flow transition between the linear flow and the rotational component flow. Transition spacer 24T extends between the screen and the blade maintaining the transition gap at a dimension sufficient to substantially isolate the linear flow through the screen region from the effects of the rotational component flow through the blade region.

26 Claims, 3 Drawing Sheets

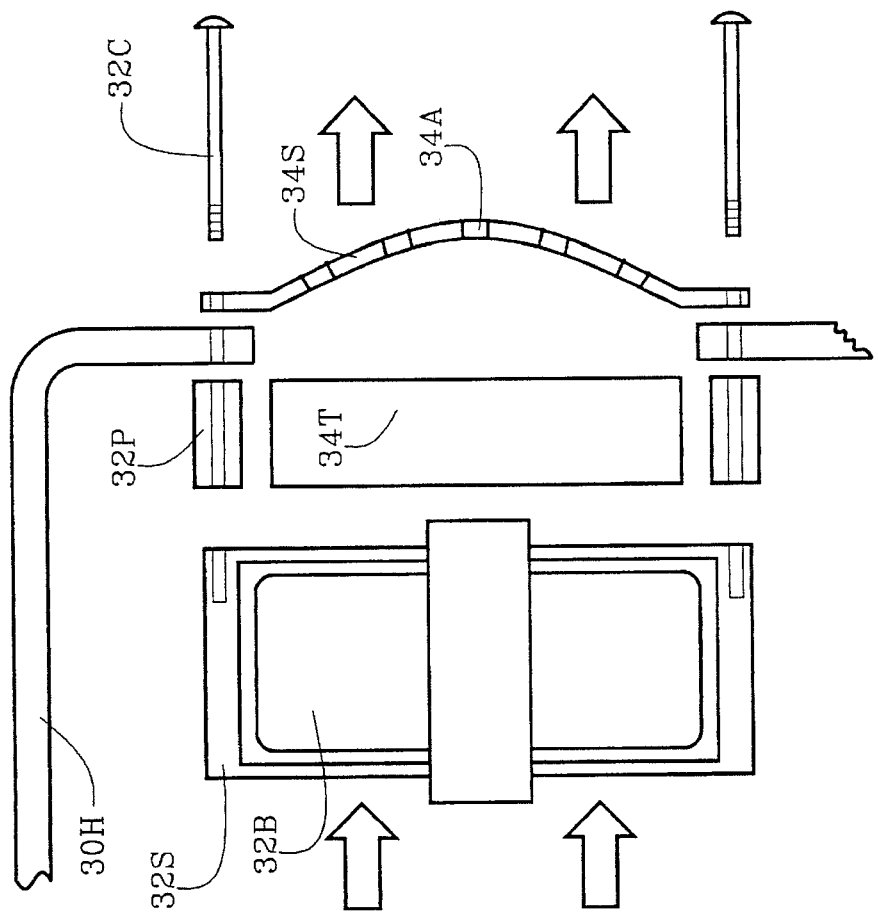
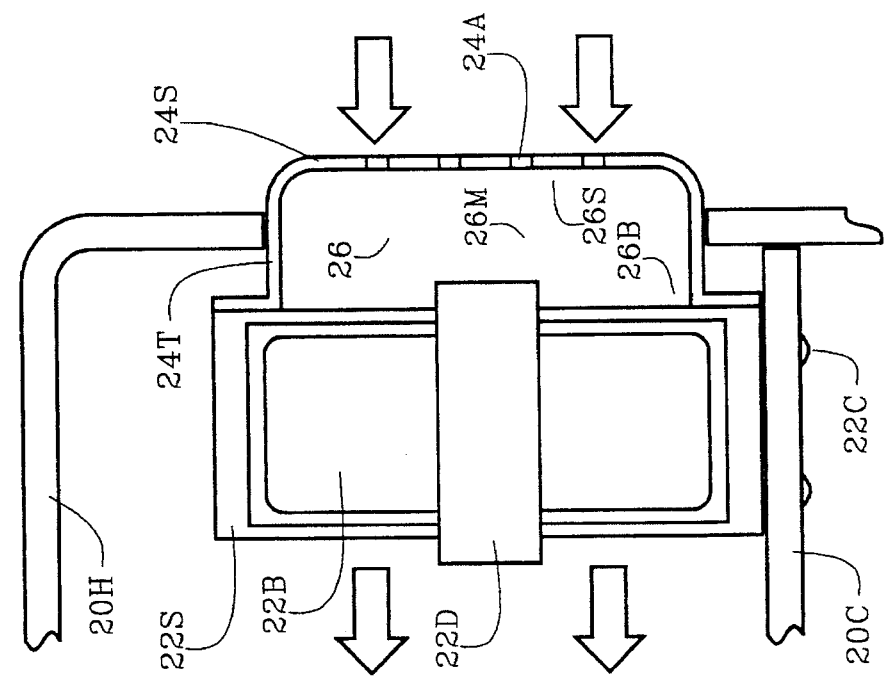

5,586,865

1

FAN WITH TRANSITION CHAMBER FOR PROVIDING ENHANCED CONVECTIVE FLOW

TECHNICAL FIELD

This invention relates to convective cooling of computers, and more particularly to a cooling fan with a transition chamber for enhancing the flow of cooling air.

BACKGROUND

Heretofore fans for computers were compactly designed to conserve space within the computer housing and minimize projections into the area behind the rear panel. The space between the screen and the fan blades was minimal to reduce the overall dimensions of the fan. A transition chamber between the screen and the fan was not employed. Further, the intake screen was typically mounted flush with the rear housing.

SUMMARY

It is therefore an object of this invention to provide an enhanced convective flow of cooling air throughout a computer apparatus.

It is a further object of this invention to provide an improved cooling air fan which supplies more cooling air flow by isolating the linear flow through the screen from rotating flow through the fan blades.

It is another object of this invention to provide an enhanced convective flow with minimal load current through the fan drive motor.

Briefly, these and other objects of the present invention are accomplished by providing a fan for delivering an enhanced cooling air flow. A fan blade is rotatably mounted within a fan support, defining a transition path through the fan for the cooling air. A stationary screen is positioned adjacent to the blade traversing the transition path. A transition chamber is formed between the screen and the blade, traversing the transition path and defining a transition gap dimension. The transition chamber has a screen region adjacent the screen, and a blade region adjacent the blade, and a middle region between the screen region and the blade region. The cooling air flow through the screen and the screen region is generally linear. The cooling air flow through the blade and the blade region has a rotational component. The middle region allows transition between the linear flow and the rotational component flow. A fan driver secured to the fan support rotates the blade to propel the cooling air flow. The rotation of the blade imparts the rotational component to the cooling air flow through the blade region. A spacer extends between the screen and the blade maintaining the transition gap at a dimension sufficient to substantially isolate the linear flow through the screen region from the effects of the rotational component flow through the blade region.

BRIEF DESCRIPTION OF THE DRAWING

Further objects and advantages of the present improved fan and the enhanced convective flow of cooling air will become apparent from the following detailed description and drawing (not drawn to scale) in which.

2

Figure 6:
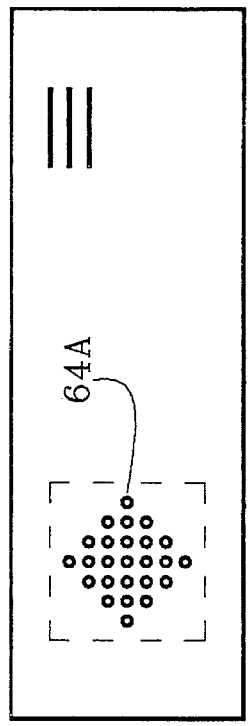
Figure 7:
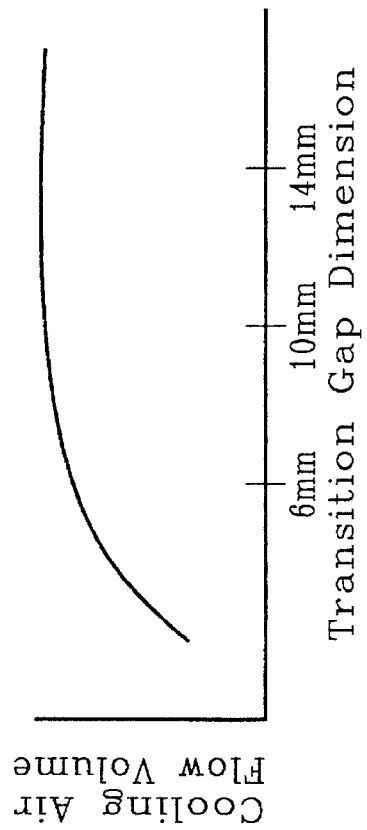
Figure 4:
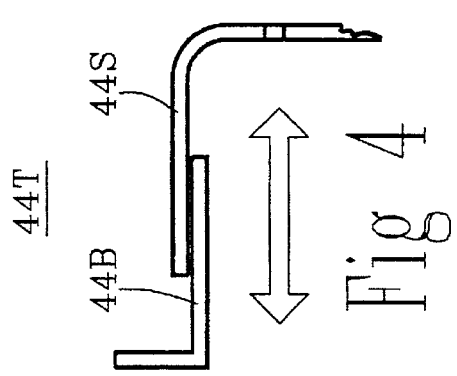
Figure 5:
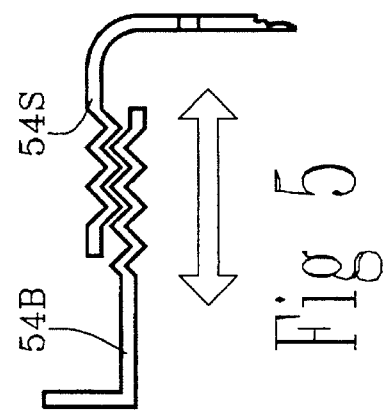

FIG. 2 is a side view in section of an improved intake fan showing a transition chamber;

FIG. 3 is a side view in section of an improved exhaust fan showing a spacer collar and mounting posts for maintaining the transition gap across the transition chamber;

FIG. 4 is a fragmentary view of a portion of a fan with a sliding interface between the screen and the shroud for adjusting the transition gap;

FIG. 5 is a fragmentary view of a portion of a fan with a threaded interface between the screen and the shroud for adjusting the transition gap;

FIG. 6 is a rear view of a computer apparatus showing a cooling air screen formed by apertures through the housing; and FIG. 7 is a graph of the transition gap dimension (horizontal axis) verses cooling air flow (vertical axis) showing the enhancement effect of the optimum gap.

The first digit of each reference numeral in the above figures indicates the figure in which that element is most prominently shown. The second digit indicates related structural elements, and the final letter (when used) indicates a sub-portion of an element.

Figure 1:
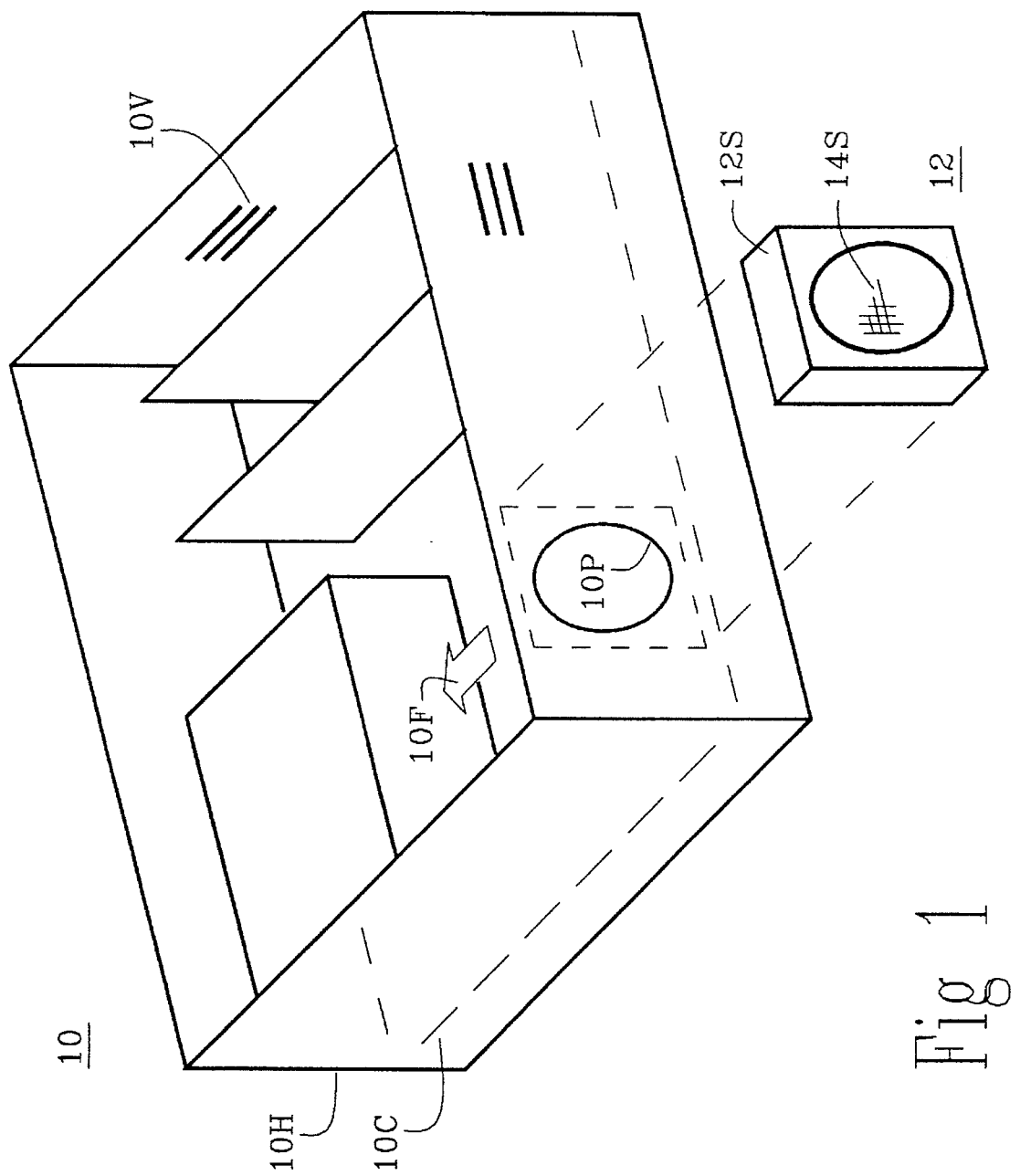
FIG. 1 is a perspective view of an improved fan mounted on a computer apparatus showing the enhanced convective cooling air flow.

GENERAL EMBODIMENT (FIGS. 1 and 2)

Computer apparatus 10 mounted on chassis 10C has enhanced convective flow 10F of circulating cooling air provided by improved fan 12. Housing 10H extends around the computer apparatus to confine the convective flow. Vents 10V through the housing assist in directing the convective flow of cooling air. Fan support 12S is secured to the computer apparatus proximate fan port 10P formed in the housing.

Fan blade 22B (shown in FIG. 2) is rotatably mounted within fan support 22S. The propelling action of the fan blade defines a transition path for the cooling air through the fan. Stationary screen 24S is positioned adjacent to the blade traversing the transition path. Transition chamber 26 formed between the screen and the blade also traverses the transition path. The width of the transition chamber defines a transition gap dimension from the screen and to the blade that is optimally selected to enhance the cooling air flow (see FIG. 7).

The transition chamber has a screen region 26S adjacent the screen and a blade region 26B adjacent the blade, and a middle region 26M between the screen region and the blade region. Cooling air flow through the screen and the screen region is generally linear. Cooling air flow through the blade and the blade region has a rotational component. When the transition gap dimension is an optimal, the middle region of the transition chamber is sufficiently wide to allow a flow transition between the linear flow and the rotational component flow.

The fan blade is rotated to propel the flow of cooling air by a suitable fan drive such as fan motor 22D secured to the fan support. The fan driver in the embodiment shown in FIG. 2 is a center drive mounted in the inner central portion of the blade. The transition path and cooling air flow is through the peripheral outer portion of the blade. The rotation of the blade imparts the rotational component to the flow of cooling air through the blade and the blade region.

Transition spacer 24T extends between the screen and the blade maintaining the transition gap at a dimension sufficient to substantially isolate the linear flow through the screen region from the effects of the rotational component flow through the blade region. The isolation enhances the flow of cooling air as described in connection with the graph of FIG. 7.

SPACER SHROUD (FIGS. 2 and 3)

Spacer 24T may be a shroud positioned between the blade and the screen and secured to the fan support, as shown in the embodiment of FIG. 2. Spacer shroud 24T extends around the periphery of the transition chamber for confining the flow of cooling air within the transition path as the cooling air passes through the fan. The shroud is peripherally secured to the fan support to prevent cooling air from leakage into or out of the transition path. Shroud 24T and screen 24S may be formed of single piece of conductive material such as metal. The fan support is secured to chassis 20C by a suitable fastening device such as chassis screws 22C which pass through the chassis and engage the fan support.

The fan shown in FIG. 2 is an intake fan for pulling cooling air into housing 20H to establish the convective flow as indicated by the arrows. Screen 24S is an intake screen for passing cooling air into the housing, and the transition chamber is an intake chamber for receiving cooling air from the screen. Flow vents provided in the housing are exhaust vents for permitting cooling air to exit from the housing.

Screen 24S has a plurality of apertures 24A formed therethrough to provide the screening of the cooling air. The apertures are preferably 5 mm or less in diameter in order to reduce rf noise leakage. The screen may be part of the housing and formed by apertures 64A through the housing material, as shown in the embodiment of FIG. 6. Alternatively, the cooling air screening may be provided by a suitable net or mesh device such as wire mesh screen 12S (shown in FIG. 1).

Transition spacer 34T and screen 34S shown in the embodiment of FIG. 3 are formed by separate pieces of conductive material. The spacer and screen are secured to housing 30H and fan support 32S by standoff posts 34P and screws 32C. Spacer 34T has the shape of a wide ring or collar which determines the transition gap. Screen 34S is positioned over the outside of spacer collar 34T. Screen 34S may have a suitable contour such as the spherical shown in the embodiment of FIG. 3. The center portion of screen 34S extends away from blade 32B. The contour increases the strength of the screen and provides slightly more area for cooling air apertures 34A.

The fan shown in FIG. 3 is an exhaust fan for pushing cooling air out of the housing to establish the convective flow as indicated by the arrows. The screen is an exhaust screen for passing cooling air out of the housing, and the transition chamber is an exhaust chamber for presenting cooling air to the screen. Flow vents provided in the housing are intake vents for permitting cooling air to enter into the housing.

ADJUSTABLE GAP (FIGS. 4 and 5)

The screens shown in the embodiments of FIGS. 1, 2 and 3 are fixed relative to the fan blades. However, the screen may be movable relative to the blade for adjusting the transition gap dimension and optimizing the cooling air flow. Spacer shroud 44T (shown in the embodiment of FIG. 4) has blade portion 44B adjacent to the blade and screen portion 44S adjacent to the screen, which overlap permitting the relative motion between the blade and the screen. The overlap between the blade portion and the screen portion permits a sliding relative motion. That is, screen portion 44S has an inside diameter slightly greater than the outside diameter of blade portion 44B, and telescopes over the blade portion. The screen may be moved closer to or further away from the blade (as indicated by the double headed arrow) effecting a corresponding change in the transition gap.

In the embodiment shown in FIG. 5, blade portion 54B and screen portion 54S have cooperating overlapping threads. The transition gap may be adjusted by rotating screen portion 54S relative to blade portion 54B, causing the screen to move closer to (or further from) the blade in order to decrease (or increase) the transition gap (as indicated by the double headed arrow).

Alternatively, adjustment of the transition gap may be accomplished by changing the size of spacer collar 34T shown in FIG. 3. A larger width collar places the screen in a position further from the blade to maintain a larger gap. Smaller width collars reduce the transition gap.

FAN POSITION

The fan may be mounted in various configurations with respect to the housing of the computer apparatus. In the embodiment shown in FIG. 1, the fan support and the fan blade and the spacer and the screen are mounted outside of the housing proximate the fan port. This outside configuration maximizes the space available inside the housing for the computer apparatus. In the embodiment shown in FIG. 2, spacer 24T and screen 24S are mounted outside of housing 20H, and fan support 22S and fan blade 22B are mounted inside the housing. In the embodiment shown in FIG. 3, fan support 32S and blade 32B and spacer collar 34T are positioned inside housing 30H. Only contoured screen 34S is outside the housing. If desired, the screen may also be mounted inside the housing to present a flush exterior surface along the rear of the housing.

OPTIMUM TRANSITION GAP (FIG. 7)

The graph of FIG. 7 shows the transition gap along the horizontal axis plotted against the volume of cooling air flow along the vertical axis. At narrow gap dimensions the cooling air flow is reduced due to the turbulent conditions existing within the transition chamber. The cooling air flow markedly increases as the gap increases until a transition gap of about 10 mm. At transition gap dimensions from about 6 mm to about 14 mm, the transition chamber is wide enough to permit an orderly transition between the linear flow through the screen and the rotational flow through the fan blade. At transition gaps in excess of about 14 mm, the volume of cooling air remains generally constant. The load current through the fan is constant regardless of the transition gap dimension. Therefore, at the optimum gap, the cooling air flow is enhanced and the load current per unit air flow is minimal.

SPECIFIC EMBODIMENT

The following particulars of the cooling air fan are given as an illustrative example of optimum convective flow. In this example,

| Blade Diameter | |
| --- | --- |
| Outer | 80 mm |
| Inner | 35 mm |
| Blade Thickness | 28 mm |

| Air Volume | 0.3 cubic meters/min |
| --- | --- |
| Blade rpms | 2900 rpm |
| Load current | 116 ma |
| Load voltage | about 20 volts |
| Rated Voltage | 24 volts |

The values dimensions and other information given above are not intended as defining the limitations of the invention. Numerous other applications and configurations are possible.

INDUSTRIAL APPLICABILITY

It will be apparent to those skilled in the art that the objects of this invention have been achieved as described hereinbefore.

Clearly various changes may be made in the structure and embodiments shown herein without departing from the concept of the invention. Further, features of the embodiments shown in the various figures may be employed with the embodiments of the other figures.

Therefore, the scope of the invention is to be determined by the terminology of the following claims and the legal equivalents thereof.

I claim as my invention:

1. Fan for delivering an enhanced cooling air flow, comprising:

fan support means;

fan blade means rotatably mounted within the fan support means defining a transition path therethrough for the cooling air;

stationary screen means positioned adjacent to the blade means traversing the transition path;

transition chamber formed between the screen means and the blade means traversing the transition path and defining a transition gap dimension between the screen means and the blade means, the transition chamber having a screen region adjacent the screen means with the cooling air flow through the screen region and the screen means being generally linear, having a blade region adjacent the blade means with the cooling air flow through the blade region and the blade means having a rotational component, and having a middle region between the screen region and the blade region allowing transition between the linear flow and the rotational component flow;

the fan support means positioned outside the transition chamber to avoid interference with the cooling air transition between the linear flow and the rotational component flow;

fan driver secured to the fan support means for rotating the blade means to propel the cooling air flow, the rotation of the blade means imparting the rotational component to the cooling air flow through the blade region and the blade means; and spacer means extending between the screen means and the blade means maintaining the transition gap at a dimension sufficient to substantially isolate the linear flow through the screen region from the effects of the rotational component flow through the blade region, for enhancing the cooling air flow.

2. The fan of claim 1, wherein the transition gap dimension is from about 6 mm to about 14 mm.

3. The fan of claim 1, wherein the transition gap dimension is about 10 mm.

4. The fan of claim 1, wherein the spacer means is a shroud positioned between the blade means and the screen means and secured to the fan support means, and extending around the periphery of the transition chamber for confining the cooling air flow within the transition path.

5. The fan of claim 4, wherein the spacer shroud and the screen means are formed by a single piece.

6. The fan of claim 4, wherein the spacer shroud and the screen means are formed by separate pieces.

7. The fan of claim 4, wherein the screen means is movable relative to the blade means for adjusting the transition gap dimension.

8. The fan of claim 7, wherein the spacer shroud has a blade portion adjacent to the blade means and a screen portion adjacent to the screen means which overlap permitting the relative motion between the blade means and the screen means.

9. The fan of claim 8, wherein the overlap between the blade portion and the screen portion permits a sliding relative motion.

10. The fan of claim 8, wherein the blade portion has threads thereon and the screen portion has cooperating overlapping threads thereon which permit relative motion between the blade means and the screen means when the screen portion is rotated relative to the blade portion.

11. The fan of claim 1, wherein the spacer means are standoff posts secured to the fan support means and to the screen means.

12. The fan of claim 1, wherein the screen means is contoured with the center portion thereof extending away from the blade means.

13. The fan of claim 12, wherein the contour of the screen means is spherical.

14. The fan of claim 1, wherein the screen means has a plurality of apertures for passing the cooling air.

15. The fan of claim 1, wherein the screen means has a wire mesh passing the cooling air.

16. The fan of claim 1, wherein the fan drive is a center drive mounted in the center of the blade means.

17. Computer apparatus with an enhanced convective flow of cooling air, comprising:

chassis means;

fan support secured to the chassis means;

fan blade means rotatably mounted within the fan support defining a transition path therethrough for the cooling air;

stationary screen means positioned adjacent to the blade means traversing the transition path;

transition chamber formed between the screen means and the blade means traversing the transition path and defining a transition gap dimension between the screen means and the blade means, the transition chamber having a screen region adjacent the screen means with the cooling air flow through the screen region and the screen means being generally linear, having a blade region adjacent the blade means with the cooling air flow through the blade region and the blade means having a rotational component, and having a middle region between the screen region and the blade region allowing transition between the linear flow and the rotational component flow;

the fan support positioned outside the transition chamber to avoid interference with the cooling air transition between the linear flow and the rotational component flow;

fan driver secured to the fan support for rotating the blade means to propel the convective flow of cooling air, the rotation of the blade means imparting the rotational component to the flow of cooling air through the blade region and the blade means; and spacer means extending between the screen means and the blade means maintaining the transition gap at a dimension sufficient to substantially isolate the linear flow through the screen region from the effects of the rotational component flow through the blade region, for enhancing the convective flow throughout the computer apparatus.

18. The computer apparatus of claim 17, further comprising:

housing means around the computer apparatus with vent means therethrough for directing the convective flow of cooling air.

19. The computer apparatus of claim 18, wherein; the fan blade means is an intake fan for pulling cooling air into the housing means to establish the convective flow, the screen means is an intake screen for passing the cooling air into the housing means, the transition chamber is an intake chamber for receiving the cooling air from the screen means, and the vent means in the housing means are exhaust vents for permitting the cooling air to exit from the housing.

20. The computer apparatus of claim 18, wherein the fan blade means is an exhaust fan for pushing cooling air out of the housing means to establish the convective flow, the screen means is an exhaust screen for passing the cooling air out of the housing means, the transition chamber is an exhaust chamber for receiving the cooling air from the blade means, and the vent means in the housing means are intake vents for permitting the cooling air to enter the housing.

21. The computer apparatus of claim 18, wherein the fan support and the blade means and the spacer means are positioned inside the housing.

22. The computer apparatus of claim 21, wherein the screen means is a plurality of apertures formed through the housing.

23. The computer apparatus of claim 21, wherein the screen means is secured to the housing.

24. The computer apparatus of claim 18, wherein the housing means has a fan port therein.

25. The computer apparatus of claim 24, wherein the fan support and the fan blade means and the spacer means and the screen means are mounted outside of the housing means proximate the fan port.

26. The computer apparatus of claim 24, wherein the spacer means and the screen means are mounted outside of the housing means proximate the fan port.

* * * * *